(12) United States Patent
Lemkin et al.

(10) Patent No.: US 6,703,679 B1
(45) Date of Patent: Mar. 9, 2004

(54) LOW-RESISTIVITY MICROELECTROMECHANICAL STRUCTURES WITH CO-FABRICATED INTEGRATED CIRCUIT

(75) Inventors: Mark A. Lemkin, El Cerrito, CA (US); William A. Clark, Fremont, CA (US); Thor Juneau, Berkeley, CA (US); Allen W. Roessig, Fremont, CA (US)

(73) Assignee: Analog Devices, IMI, Inc., Berkeley, CA (US)

( * ) Notice: Subject to any disclaimer, the term of this patent is extended or adjusted under 35 U.S.C. 154(b) by 0 days.

(21) Appl. No.: 09/612,482

(22) Filed: Jul. 7, 2000

Related U.S. Application Data

(60) Provisional application No. 60/151,774, filed on Aug. 31, 1999.

(51) Int. Cl.[7] .............................................. H01L 29/00
(52) U.S. Cl. ....................... 257/513; 257/515; 257/507; 257/524; 73/514.33
(58) Field of Search ............................... 257/513, 515, 257/507, 524; 73/514.32

(56) References Cited

U.S. PATENT DOCUMENTS

| | | | |
|---|---|---|---|
| 4,801,556 A | | 1/1989 | Welbourn et al. |
| 5,001,538 A | | 3/1991 | Pollock et al. |
| 5,004,705 A | * | 4/1991 | Blackstone .................. 437/225 |
| 5,084,408 A | | 1/1992 | Baba et al. |
| 5,188,971 A | | 2/1993 | Pollock et al. |
| 5,198,390 A | | 3/1993 | MacDonald et al. |
| 5,326,726 A | | 7/1994 | Tsang et al. |
| 5,343,064 A | | 8/1994 | Spangler et al. |
| 5,445,988 A | | 8/1995 | Schwalke |
| 5,447,067 A | | 9/1995 | Biebl et al. |

(List continued on next page.)

OTHER PUBLICATIONS

Brosnihan, T., *An SOI Based, Fully Integrated Fabrication Process for High–Aspect–Ratio Microelectromechanical Systems,* Doctoral Thesis, U.C. Berkeley, Fall 1998.

Sridhar, U. et al., "Isolation Process for surface micromachined sensors and actuators," *iMEMS '97 International MEMS Workshop,* National University of Singapore, Singapore, Dec. 1997.

Sridhar, U. et al., "Single crystal silicon microstructures using trench isolation," *Transducers '99,* Sendai Japan, pp. 258–261, Jun., 1999.

J.W. Weigold, W.H. Juan, S.W. Pang, "Etching and boron diffusion of high aspect ratio Si trenches for released resonators," *J. Vac. Sci. Technol, B,* pp. 267–272, Mar./Apr. 1997.

J.W. Weigold, A.–C. Wong, C. T.–C. Nguyen, and S. W. Pang, "Thick Single Crystal Si Lateral Resonant Devices Integrated with a Conventional Circuit Process", *Late News IEEE Solid–State Sensor and Actuator Workshop,* Hilton Head Island, SC, Jun. 1998.

U.S. patent application Ser. No. 08/874,568, Brosnihan et al., filed Jun. 13, 1997, pending.

U.S. patent application Ser. No. 09/322,381, May 28, 1999, Clark et al., pending.

Primary Examiner—George Eckert
Assistant Examiner—Joseph Nguyen
(74) Attorney, Agent, or Firm—Vierra Magen Marcus Harmon & DeNiro LLP

(57) ABSTRACT

A microfabricated device includes a substrate having a device layer and substantially filled, isolating trenches; a doped region of material formed by photolithographically defining a region for selective doping of said device layer, selectively doping said region, and thermally diffusing said dopant; circuits on said device layer formed using a substantially standard circuit technology; and at least one structure trench in the substrate which completes the definition of electrically isolated micromechanical structural elements.

16 Claims, 7 Drawing Sheets

U.S. PATENT DOCUMENTS

| | | |
|---|---|---|
| 5,495,761 A | 3/1996 | Diem et al. |
| 5,504,026 A | 4/1996 | Kung |
| 5,506,175 A | 4/1996 | Zhang et al. |
| 5,569,852 A | 10/1996 | Marek et al. |
| 5,574,222 A | 11/1996 | Offenberg |
| 5,576,250 A | 11/1996 | Diem et al. |
| 5,578,755 A | 11/1996 | Offenberg |
| 5,583,348 A * | 12/1996 | Sundaram ............... 257/73 |
| 5,592,015 A | 1/1997 | Iida et al. |
| 5,614,750 A * | 3/1997 | Ellul et al. ............. 257/386 |
| 5,616,523 A | 4/1997 | Benz et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,700,702 A | 12/1997 | Klose et al. |
| 5,719,073 A | 2/1998 | Shaw et al. |
| 5,723,353 A | 3/1998 | Muenzel et al. |
| 5,747,353 A * | 5/1998 | Bashir et al. ............ 437/21 |
| 5,747,867 A | 5/1998 | Oppermann |
| 5,756,901 A | 5/1998 | Kurle et al. |
| 5,798,283 A | 8/1998 | Montague et al. |
| 5,847,280 A | 12/1998 | Sherman et al. |
| 5,847,454 A | 12/1998 | Shaw et al. |
| 5,882,532 A | 3/1999 | Field et al. |
| 5,940,711 A * | 8/1999 | Zambrano ............. 438/366 |
| 5,959,208 A | 9/1999 | Muenzel et al. |
| 6,049,108 A * | 4/2000 | Williams et al. ......... 257/341 |
| 6,121,552 A * | 9/2000 | Brosnihan et al. ....... 174/253 |
| 6,225,181 B1 * | 5/2001 | Gregory ................ 438/355 |

\* cited by examiner

LOW-RESISTIVITY MICROELECTROMECHANICAL STRUCTURES WITH CO-FABRICATED INTEGRATED CIRCUIT

CROSS-REFERENCE TO RELATED APPLICATION

This application claims priority to U.S. Provisional Application Ser. No. 60/151,774 filed Aug. 31, 1999 entitled "LOW-RESISTIVITY MICROELECTROMECHANICAL STRUCTURES WITH CO-FABRICATED INTEGRATED CIRCUITS."

IDENTIFICATION OF GOVERNMENT INTEREST

This invention was made with Government support under F49620-98-C-0082 awarded by the Air Force Office of Scientific Research. The Government has certain rights in the invention.

BACKGROUND OF THE INVENTION

1. Field of the Invention

This invention relates generally to microfabricated devices, and more particularly to three-dimensional devices fabricated in a semiconductor substrate suitable for co-fabrication with integrated circuitry.

2. Description of the Related Art

MicroElectroMechanical Systems (MEMS) often combine mechanical structures and microelectronic circuits to create integrated devices. MEMS have many useful applications such as filters, resonators, microsensors and microactuators. Examples of microsensors include inertial instruments such as accelerometers and gyroscopes, detectors for gasses such as carbon monoxide, and pressure sensors. Examples of microactuators include optical mirrors used for video displays, optical mirrors used in fiber-optic communication systems such as optical switches or multiplexors, and disk-drive head actuators used for increasing track density.

The performance of many devices such as accelerometers, gyroscopes, and closed-loop actuators may benefit from combining high-aspect-ratio structures with circuits integrated in the same substrate. Hence, a high-aspect-ratio structure etched into a single crystal silicon substrate that also contains integrated circuits is of particular interest. Of even greater interest is a process sequence that yields structures and circuits in the same substrate but does not significantly alter complex and expensive circuit fabrication processes. Such a process sequence enables cost-effective manufacture of devices comprising integrated circuits and structures on a single substrate.

Many MEMS-based devices utilize electrical circuits combined with air-gap capacitors to sense motion, or to apply electrostatic forces to a movable structure. Air-gap capacitors are often formed between sets of capacitor plates anchored to a substrate interleaved with plates attached to a movable structure. The performance of many capacitive-based MEMS improves as: 1) the overlap area of capacitor plates increases, 2) the distance between stationary and movable capacitor plates decreases, 3) the compliance of structures vary dramatically in different directions, 4) the mass of structures increases, and 5) the resistance of the material comprising mechanical structures decreases. The first through fourth of these performance issues are enhanced using high-aspect-ratio semiconductor technologies, wherein thickness or depth of fabricated structures is much larger than small lateral dimensions of features such as width of flexible beams and gaps between capacitor plates.

Commercial fabrication of high-quality, active electrical devices, including transistors, requires a substrate of single-crystal semiconducting material with a relatively high resistivity (in a range of about 5–50 Ohm-cm). Unfortunately, high-resistivity material is undesirable for electromechanical sense-elements due to, among other reasons: increased thermal noise, and slow electrical settling inherent in highly-resistive structures.

Often circuit elements are formed on an epitaxial layer of lightly-doped silicon grown on a layer of heavily doped silicon to improve the characteristics of devices formed therein, such as reduced susceptibility to latch-up. In this context, lightly- and heavily-doped silicon are discriminated by their bulk resistivity: lightly-doped silicon has a bulk resistivity above 1 Ohm-cm, and heavily-doped silicon has a bulk resistivity less than 0.1 Ohm-cm. When mechanical devices are formed into the surface of an epitaxial wafer, at least a portion of the mechanical device includes lightly-doped, or high-resistivity, silicon. Consequently, the contact resistance from the exposed surface of the epitaxy to the underlying low-resistivity material may be undesirably high.

Examples of fabrication processes that may include integrated circuits on the same substrate as mechanical structures, and in which the circuits may be formed in a lightly-doped layer formed on a heavily doped layer of silicon appear in the literature (see for example: Brosnihan, T. et al., "Embedded Interconnect and Electrical Isolation for High-Aspect-Ratio, SOI Inertial Instruments," *Proc.* 1997 *International Conference on Solid-State Sensors and Actuators,* Chicago, Ill., pp. 637–640, Jun. 16–19, 1997; Sridhar, U. et al. "Isolation Process for surface micromachined sensors and actuators," *iMEMS '97 International MEMS Workshop,* National University of Singapore, Singapore, December, 1997. See also: USPTO RPA Clark et al., application Ser. No. 09/322,381 Filed May 28, 1999; USPTO PPA Clark et al. application No. 60/127,973 Filed Apr. 6, 1999). These and similar processes, which include mechanical structures co-fabricated with circuits on a single substrate, are referred to herein as "co-fabricated deep-MEMS" or CDMEMS.

CDMEMS processes employ fabrication methods, or processing steps, that at some point provide a substrate material having exposed, filled, isolation trenches. Wafers at this step in their processing are hereby termed pre-circuit wafers (PCWs). However, none of the processes or structures in the previously-cited documents fully solves the problem of combining low-resistivity micromechanical structures with circuits on a single substrate.

SUMMARY OF THE INVENTION

The invention, roughly described, comprises methods and devices for co-fabricating electrical circuits and mechanical structures on a single substrate.

In one aspect, the invention is directed to a method of fabricating microelectromechanical systems. The method includes: providing a substrate having a device layer, photolithographically defining a region for selective doping of said device layer, doping said device layer region, thermally diffusing said dopant, forming circuits on said device layer using a substantially standard circuit technology, and etching a second set of trenches in the substrate to complete the definition of electrically isolated structural elements.

In another aspect, the invention is directed to a microfabricated device. The device includes a substrate having a device layer and filled, isolating trenches; a doped region of material formed by photolithographically defining a region for selective doping of said device layer, selectively doping said region, and thermally diffusing said dopant; circuits on said device layer formed using a substantially standard circuit technology; and a second set of trenches in the substrate that complete the definition of electrically isolated structural elements.

The invention is advantageous because the invention enables low-resistance mechanical structures to be co-fabricated into the same substrate on which active semiconductor devices, such as transistors, are formed. The invention provides for easy and accurate alignment of sinker diffusion to areas where structures and circuits are subsequently formed. Depending on circuit technology specificities, the invention may reduce structural resistance by up to several orders of magnitude while requiring minimal modification of circuit processing. The invention improves performance of a large class of sensors and actuators. Furthermore, the benefits of the invention may be attained using a minimal number of processing steps.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout all the views of the drawings.

DETAILED DESCRIPTION

The invention will be hereafter described after provision of a starting wafer or material substrate. Those of average skill will understand that the starting material may be fabricated by any number of well-known techniques.

Examples of four embodiments of PCW starting material are shown in FIG. 1 through FIG. 4. It should be understood that in order to practice the invention, PCW starting material 50, 60, 70, 80 need not be limited to the four embodiments shown in FIGS. 1 thorough 4. In addition, the techniques for fabricating the PCW starting material are well known. Each PCW includes a device layer 51, 61, 71, 81 in which the circuits and mechanical structures are to be formed. The said device layer also includes a plurality of filled, exposed trenches 52, 62, 72, 82. It should be understood that the term "filled" in the context of this disclosure means filled with material to the extent practicable given the technology chosen to fabricate the trench, and with material sufficient to provide electrical isolation between adjacent silicon regions bordering the trench.

Figure 1:
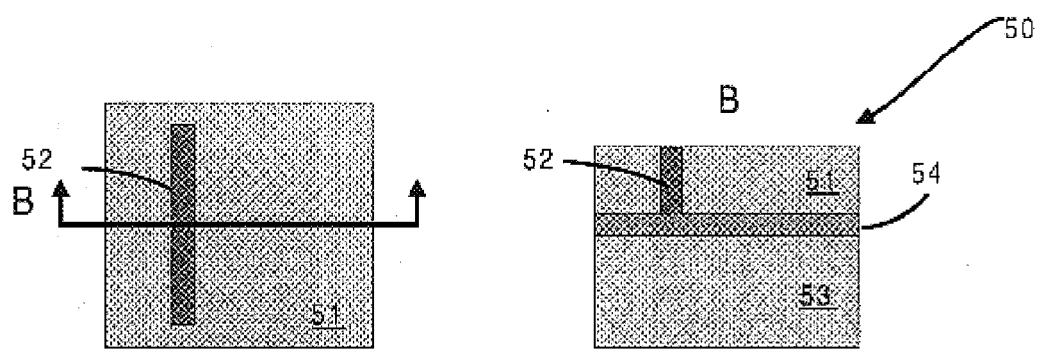
FIG. 1 is a cross-sectional view of a PCW including a silicon-on-insulator substrate.
Figure 2:
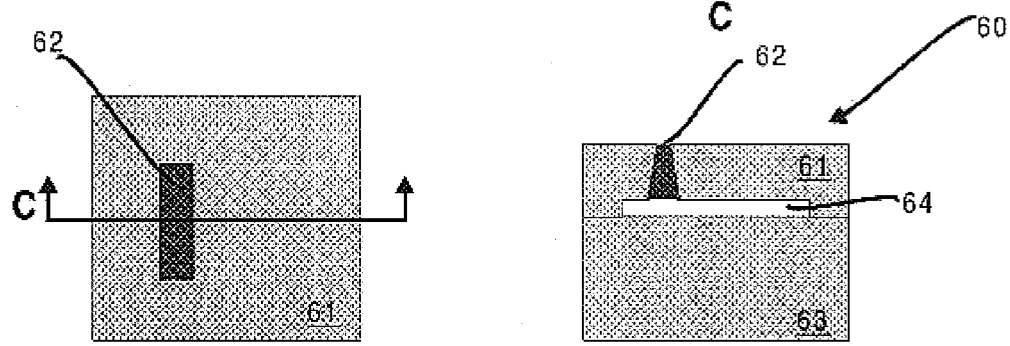
FIG. 2 is a cross-sectional view of a first embodiment of a PCW including a buried cavity.
Figure 3:
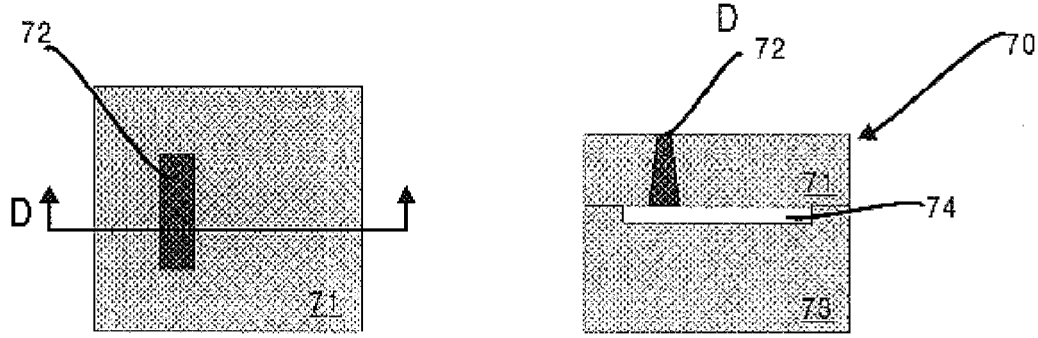
FIG. 3 is a cross-sectional view of a second embodiment of a PCW including a buried cavity.
Figure 4:
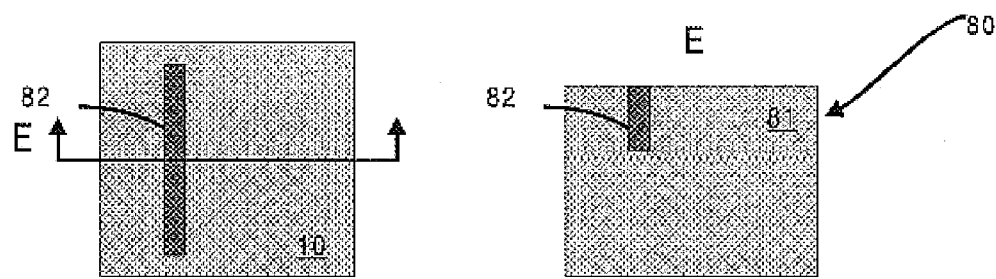
FIG. 4 is a cross-sectional view of a PCW comprising of a device layer having a substantially conventional thickness.
Figure 5:
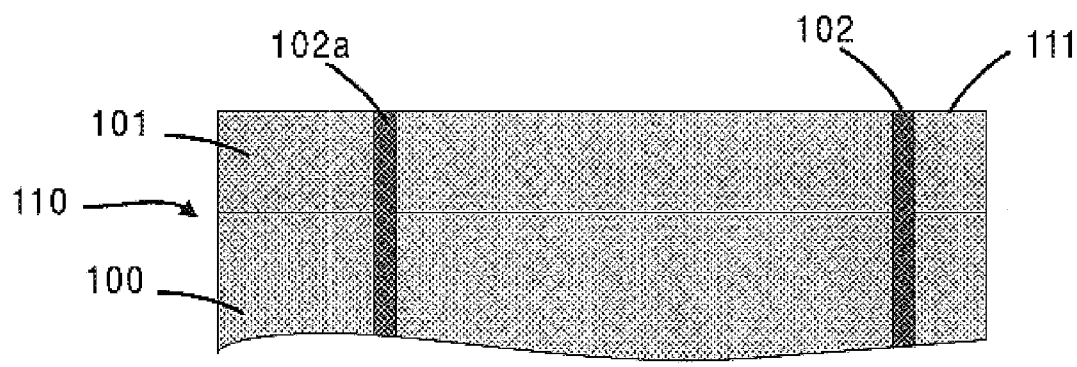
FIG. 5 is a cross-sectional view of a device layer including an alignment trench, and an isolation trench.

The device layer, shown in FIG. 5, includes lightly-doped single-crystal silicon, and may include a lightly-doped silicon layer 101 on top of a heavily-doped silicon layer 100. When the device layer comprises a lightly-doped silicon layer on top of a heavily-doped silicon layer, the lightly doped silicon layer is typically 1 to 20 microns thick with a resistivity greater than 1 Ohm-cm, while the heavily-doped silicon layer typically has a resistivity less than 0.1 Ohm-cm and is typically greater than 5 microns thick. If the lightly-doped silicon layer is predominantly p-type than the heavily-doped silicon layer is typically predominantly p-type. If the lightly-doped silicon layer is predominantly n-type than the heavily-doped silicon layer is typically predominantly n-type; however, it is not necessary for the lightly and heavily doped layers to be the same type, and in another embodiment of the invention, the lightly and heavily doped layers are of opposite type.

The lightly-doped layer may be formed by growing lightly-doped epitaxial silicon on a heavily-doped layer of silicon. Depending on the CDMEMS technology, the PCW may also be formed by bonding a lightly-doped silicon layer having a thin, heavily-doped, surface layer of silicon to a handle wafer. When a lightly-doped silicon layer having a thin, heavily-doped, surface layer of silicon is bonded to a handle wafer, the heavily-doped silicon layer may be formed by epitaxial growth, implantation and diffusion, or open-furnace-tube diffusion with a solid, liquid, or gas doping source.

The PCW is often a substantially cylindrical wafer having a thickness of approximately 250 microns to 2 millimeters, and a diameter from approximately 100 mm to 300 mm. The wafer dimensions are typically chosen so that standard microelectronics processing techniques, tools, and handling equipment may be used. Depending on the CDMEMS technology the PCW may comprise, for example, any of the following: a silicon-on-oxide wafer, the silicon-on-oxide wafer including device layer 51, handle layer 53, and bonding layer 54; device layer 61 bonded to handle layer 63, device layer 61 having cavities 64 in that face of device layer 61 bonded to handle layer 63; device layer 71 bonded to handle layer 73, handle layer 73 having cavities 74 in that face of handle layer 73 bonded to device layer 71. Alternatively, the PCW may include device layer 81 having a substantially conventional thickness.

When a handle layer is included in the PCW, the handle layer serves to thicken the PCW to a thickness suitable for use with standard microelectronics processing techniques, tools, and handling equipment. Often, conventional thickness wafers are bonded in the process of forming a PCW. To thin a bonded wafer pair to a substantially conventional thickness, material may be removed from the device layer or the handle layer by a grinding process. Since integrated circuits are to be formed on the surface of the device layer, grinding of the device layer is followed by a polishing operation that may include a chemical-mechanical polishing (CMP) step to result in mirror-like surface.

For clarity in understanding the invention the remainder of this teaching will illustrate the invention showing only a device layer, since the location and purpose of any handle or bonding layer has been established, and is not material to understanding the remainder of the teachings. Again, it should be understood that the present invention is not limited to a particular embodiment restricted by a PCW including a handle layer.

FIG. 5 shows cross-sectional view of lightly-doped layer 101 on heavily-doped silicon layer 100, forming device layer 110. In another embodiment of the invention, a device layer is formed from a single layer of lightly-doped silicon. With reference to FIG. 5, in a first embodiment of the invention, a PCW is provided with at least two trenches 102 exposed from first surface 111 of device layer 110. Trenches 102 may be used to align masks during processing steps and are hence hereinafter referred to as "alignment" trenches, although such trenches may also serve the function of insulating adjacent regions of silicon. When a PCW includes only two exposed alignment trenches 102, such trenches will typically be spaced greater than 5 cm apart. A PCW will typically include two or more trenches used for alignment, as well as a plurality of other isolation trenches 102a. One benefit of the present invention is that exposed alignment trenches 102 enable accurate alignment of a first photolithographic mask used to define sinker areas to isolation trenches. Typically, at least one circuit mask will also be aligned to these alignment trenches, thereby providing a method for attaining good, indirect alignment of the subsequently formed sinker to the subsequently formed circuit elements. In this context, a sinker is defined as a region of heavily doped silicon extending from first surface of device layer 111 into the device layer, this region defined by said first masking step. It should be recognized that other alignment structures may be used without departing from the scope of the present invention.

Figure 6:
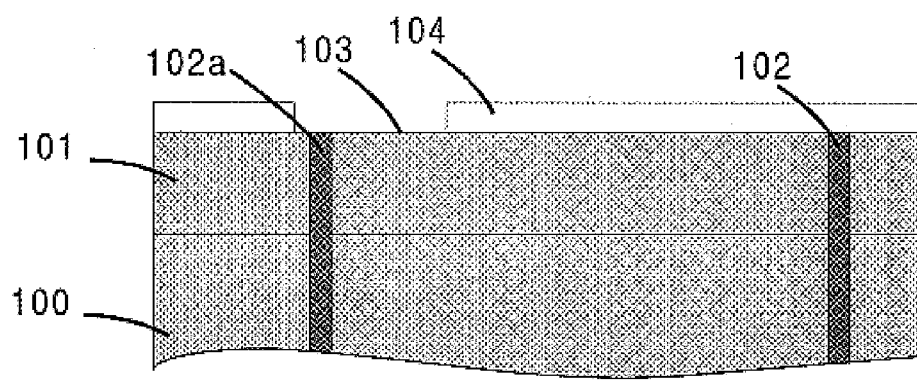
FIG. 6 is a cross-sectional view of a device layer including an alignment trench, an isolation trench, and a pattern.

FIG. 6 shows a photolithographically defined mask 104 aligned to alignment trenches 102, formed in a photosensitive material, or photoresist, on first surface 111. Alternatively, photolithographically defined mask 104 may be patterned, using photoresist, in hardmasking materials such as grown or deposited silicon dioxide or deposited silicon nitride.

Figure 7:
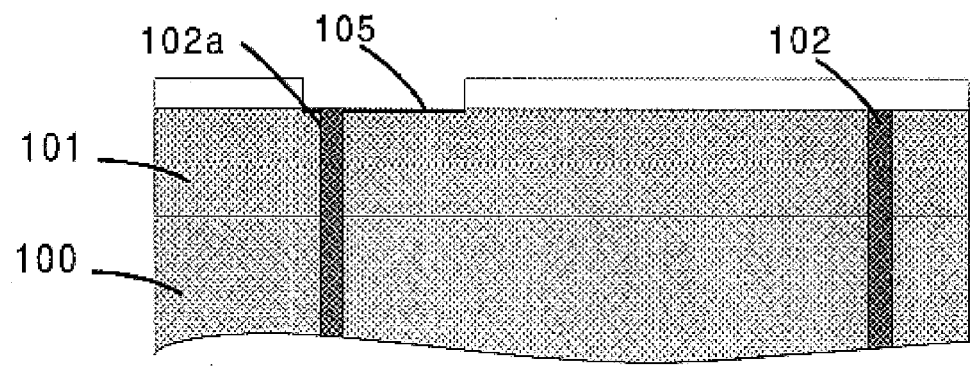
FIG. 7 is a cross-sectional view of a device layer including an alignment trench, an isolation trench, a pattern, and a doped region defined by a pattern.

Referring to FIG. 7, following patterning, exposed first surface material 103 is doped, using pattern 104 to define doped regions 105 of device layer 110 where sinkers are later formed. If photoresist is used as a masking material, ion implantation may provide desired doping species for regions 105. Typical ion-implant doses are of the order of $1 \times 10^{14}$ cm$^{-2}$ to $1 \times 10^{16}$ cm$^{-2}$. If a hard-mask material is used as the masking material, several methods may dope the unmasked surface of device layer 110 including: open-furnace-tube diffusion with a solid, a liquid, or a gas source; spin-on doping; or ion implantation. When device layer 110 includes lightly-doped layer 101 on heavily-doped layer 100, the sinker dopant type is similar (i.e. p-type or n-type) to the doping type of the heavily doped silicon layer, although the species may be different. For example, if the heavily-doped silicon layer includes antimony, making the layer n-type, the sinker may be formed using a different n-type dopant, such as phosphorous.

Figure 8:
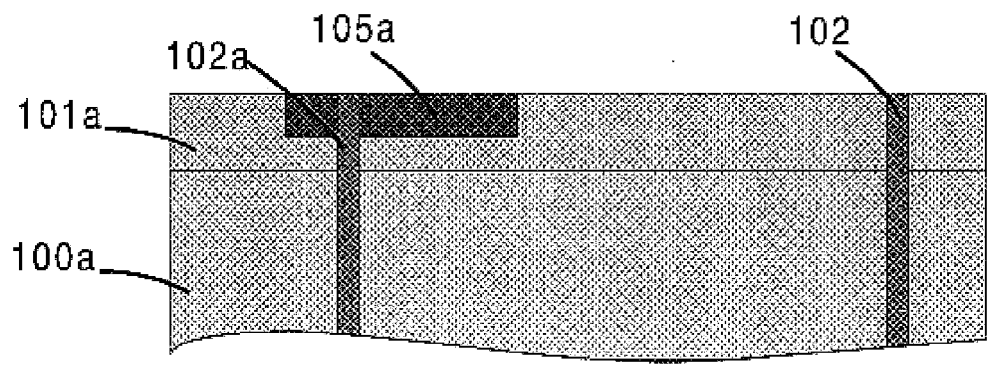
FIG. 8 is a cross-sectional view of a device layer including an alignment trench, an isolation trench, and an initial sinker.

Referring to FIG. 8, following formation of region 105, any remaining photoresist is removed, the wafers are cleaned with a pre-furnace clean that may include a RCA clean, and a high-temperature sinker drive-in diffusion step is performed to drive the dopant deep into the lightly doped layer, forming initial sinker 105a. Typical diffusion temperatures are between 1000° C. and 1250° C. and are applied for a period sufficient to accomplish diffusion based on the diffusivity of the dopant species used. Typical diffusion distances for region 105 during this step are 1 to 10 microns, and will be determined in conjunction with the particular circuit technology. (The circuit technology will dictate required epitaxial thickness, if any, and will include a series of diffusion steps causing additional diffusion of the sinker.) When a hard mask is used, the hard mask may include silicon nitride to protect regions of lightly-doped surface 111 where circuits are subsequently formed from undesired doping or contamination during drive-in. Alternatively, when a photoresist mask is used to define implanted areas, a thin layer (25 nm–200 nm) of silicon nitride may be blanket-deposited directly or deposited on a thin layer of grown or deposited (25 nm–200 nm) silicon dioxide following photoresist removal, thereby protecting surface 111 from undesired doping or contamination during sinker drive-in.

After sinker drive-in, hard-mask material 104 (or protective dielectric material) is removed, circuitry is formed by aligning a first circuit mask to exposed alignment trenches, and mechanical structures are defined and released according to the specificities of the particular CDMEMS technology. Circuits may include active devices such as transistors, and electrical connections such as wires.

Figure 9:
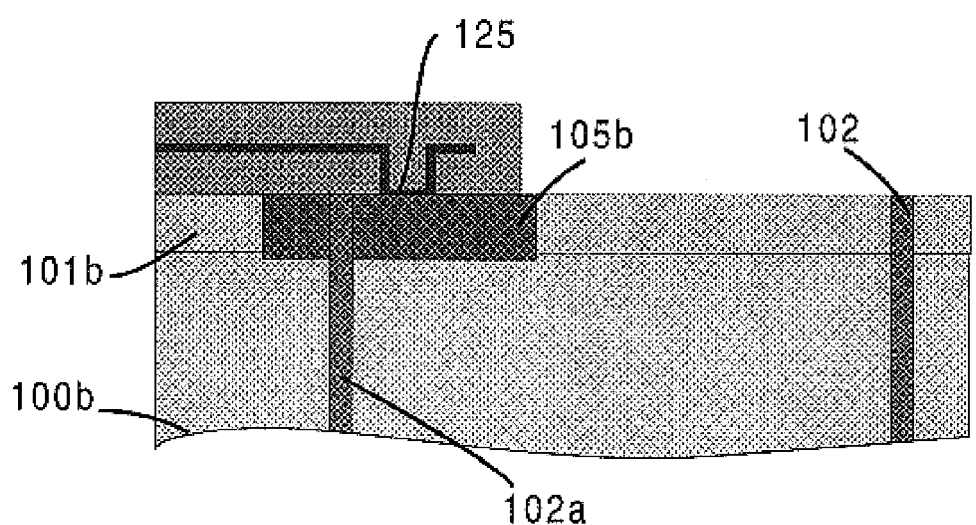
FIG. 9 is a cross-sectional view of a device layer including an alignment trench, an isolation trench, a final sinker, and an electrical contact to a final sinker.

As shown in FIG. 9, contact to isolated regions of silicon is made by one or more substrate contacts 125 formed during circuit formation.

Figure 10:
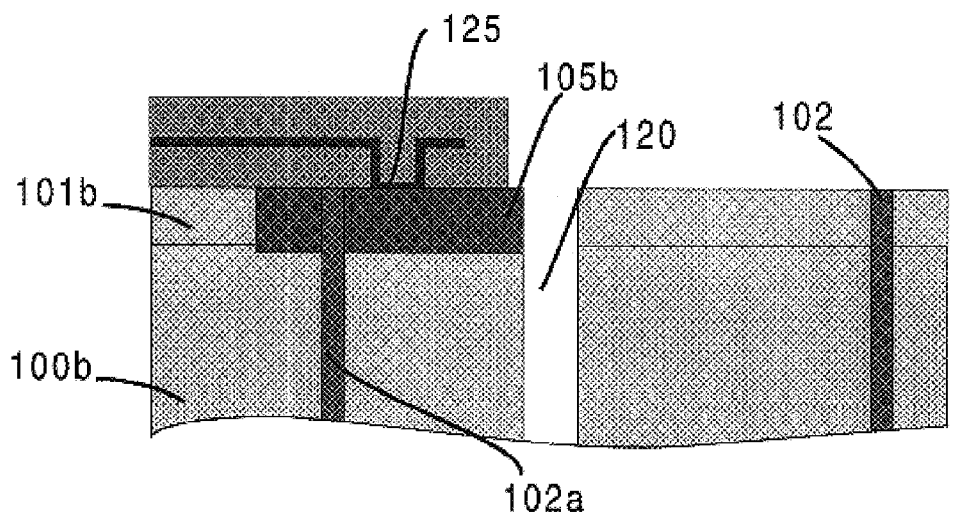
FIG. 10 is a cross-sectional view of a device layer including an alignment trench, an isolation trench, a final sinker, and an electrical contact to an isolated structure.

Subsequently, as shown in FIG. 10, mechanical structures are defined by etching a plurality of trenches 120 into the device layer.

During circuit formation, initial sinker 105a will diffuse further due to high temperature processing steps, forming final sinker 105b. When device layer 110 comprises lightly-doped layer 101 on heavily-doped silicon substrate 100, up-diffusion during sinker-drive in and circuit processing will dope lightly-doped layer 101 from the bottom, resulting in reduced-thickness, lightly-doped layer 101a,b. A low-resistivity structure may be formed if final sinker 105b extends at least as deep as up-diffused dopants from heavily-doped layer 100. Note that a diffusion boundary is defined as the location where dopant concentration from an implant or doped layer equals the background dopant concentration.

The sinker drive-in beneficially enables the sinker depth and doping profile to be decoupled from circuit diffusions. This decoupling enables formation of sinker 105b extending further into device substrate 110 than a typical well in a CMOS technology, thereby providing for low resistivity structures while not affecting circuit parameters. When device layer 110 includes lightly-doped layer 101 on heavily-doped layer 100, the thickness of lightly-doped layer 101 will typically have to be increased over the nominal lightly-doped layer thickness for standard processing due to up-diffusion of dopants from heavily-doped silicon 100 during sinker drive-in. When device layer 110 includes lightly-doped layer 101 on heavily-doped layer 100, sinker 105b will typically extend into the wafer, merging into heavily-doped silicon layer 100b. When device layer 110 layer does not include heavily-doped layer 100, sinker 105b will typically extend as deep as the subsequently defined mechanical structures.

Figure 11:
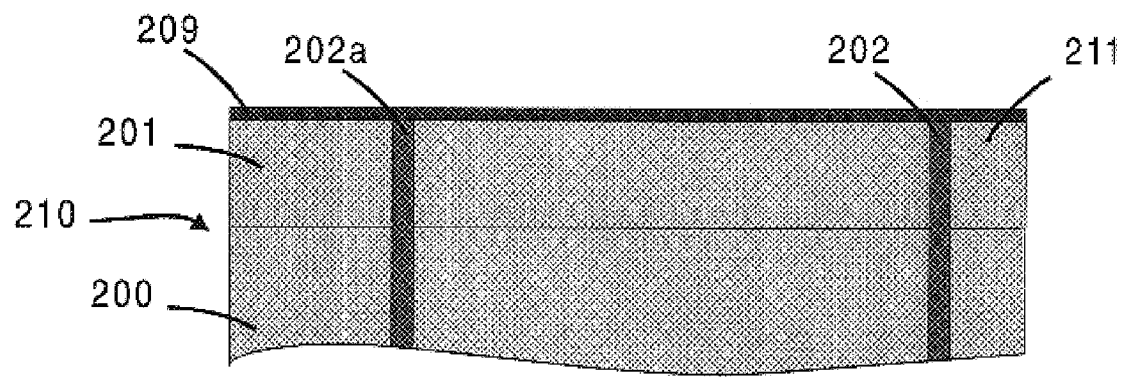
FIG. 11 is a cross-sectional view of a device layer including an alignment trench, an isolation trench, and a dielectric layer.

In a second embodiment of the invention, a PCW is provided with at least two alignment trenches exposed from a first surface of the PCW. FIG. 11 shows a cross-sectional view of a PCW having a lightly-doped layer 201 on heavily-doped layer 200. Thin dielectric layer 209 (having a thickness of about 20–100 nm) is grown or deposited. Dielectric layer 209 may include grown or deposited silicon dioxide or deposited silicon nitride.

Figure 12:
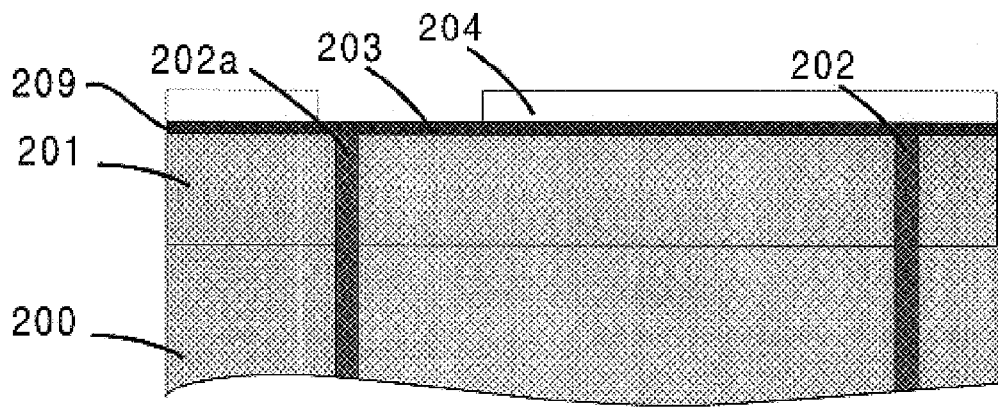
FIG. 12 is a cross-sectional view of a device layer including an alignment trench, an isolation trench, a dielectric layer, and a pattern.
Figure 13:
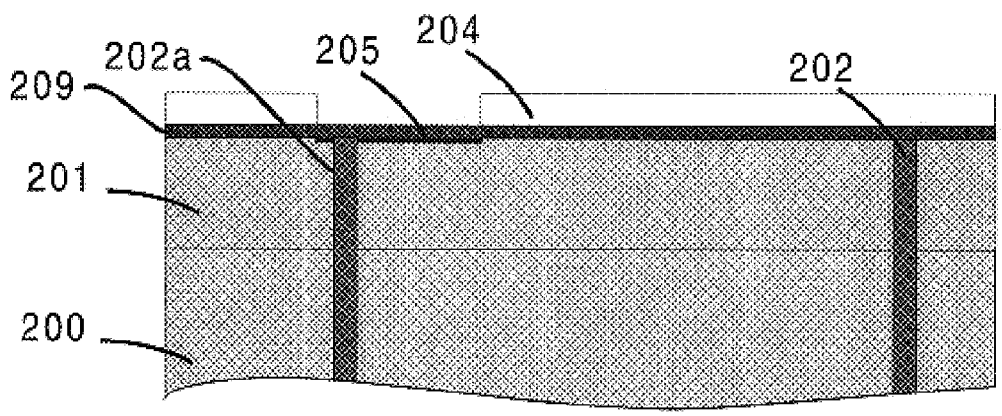
FIG. 13 is a cross-sectional view of a device layer including an alignment trench, an isolation trench, a dielectric layer, a pattern, and a doped region defined by a pattern.

Referring to FIG. 12, a photolithographic mask is aligned to alignment trenches 202 and used to form a first pattern in a photosensitive material 204, on dielectric layer 209. Next, exposed substrate material 203 is doped using ion implantation to provide desired doping species to region 205 (FIG. 13). Implanting through thin layer of dielectric material 209 aids in screening against contamination from metals or other impurities during the implant. In addition, implanting through thin layer of dielectric material 209 reduces channeling of implanted ions. Typical doses are of the order of $1\times10^{14}$ cm$^{-2}$ to $1\times10^{16}$ cm$^{-2}$. When device layer 210 includes lightly-doped layer 201 on heavily-doped layer 200 the sinker dopant type is similar (i.e. p-type or n-type) to the doping type of heavily doped silicon layer 200, although the species may be different. Next photosensitive material 204 is removed.

Figure 14:
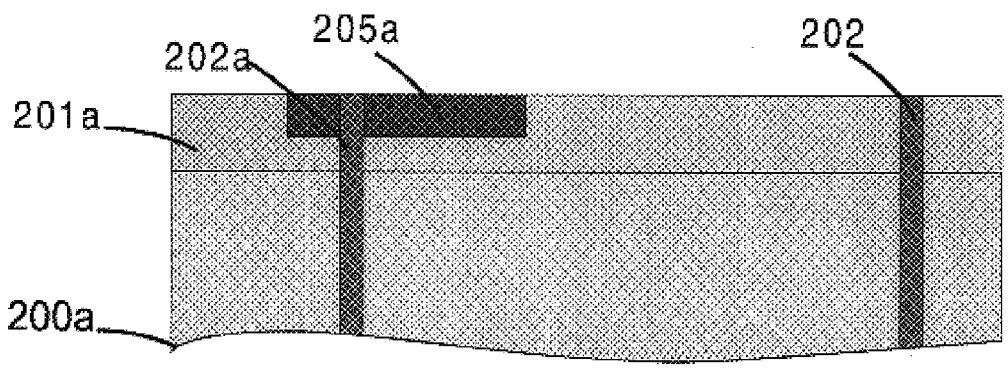
FIG. 14 is a cross-sectional view of a device layer including an alignment trench, an isolation trench, and an initial sinker.

Next, a high-temperature sinker drive-in diffusion step is performed to drive the dopant deep into the lightly doped layer, forming initial-sinker 205a, illustrated in FIG. 14. After drive-in, dielectric material 209 is removed.

Figure 15:
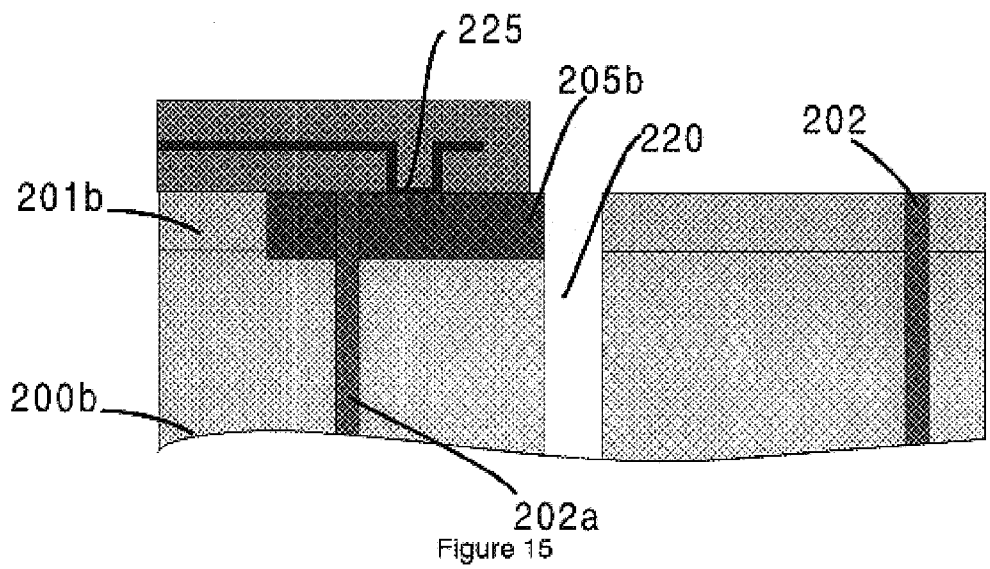
FIG. 15 is a cross-sectional view of a device layer including an alignment trench, an isolation trench, a final sinker, and an electrical contact to an isolated structure.

Aligned circuitry is then formed by aligning a first circuit mask to exposed alignment trenches, and mechanical structures are defined and released according to the specificities of the particular CDMEMS technology. The resulting structure is shown in FIG. 15. Contact to mechanical structures is made by one or more substrate contacts 225 formed during circuit formation.

Following circuit formation, mechanical structure definition includes etching a plurality of trenches 220 into the device layer. During circuit formation, initial sinker 205a will diffuse further due to high temperature processing steps, forming final sinker 205b. When device layer 210 comprises lightly-doped layer 201 on heavily-doped silicon substrate 200, up-diffusion during sinker-drive in and circuit processing will dope lightly-doped layer 201 from the bottom, resulting in reduced-thickness, lightly-doped layer 201a, 201b. A low-resistivity structure may be formed if final sinker 205b extends at least as deep as up-diffused dopants from heavily-doped layer 200.

In a third embodiment of the invention, the sinker drive-in and diffusion steps are integrated into a CMOS process flow. The specifics of CMOS processing are well known by those skilled in the art, and there are many references on the subject, for example (S. Wolf, R. N. Tauber, *Silicon Processing for the VLSI Era Volume 1—Process Technology*, Lattice Press, Sunset Beach, Calif., 1986; S. Wolf, *Silicon Processing for the VLSI Era Volume 2—Process Integration*, Lattice Press, Sunset Beach, Calif., 1990.) There are also numerous process sequences suitable for defining CMOS devices.

Figure 16:
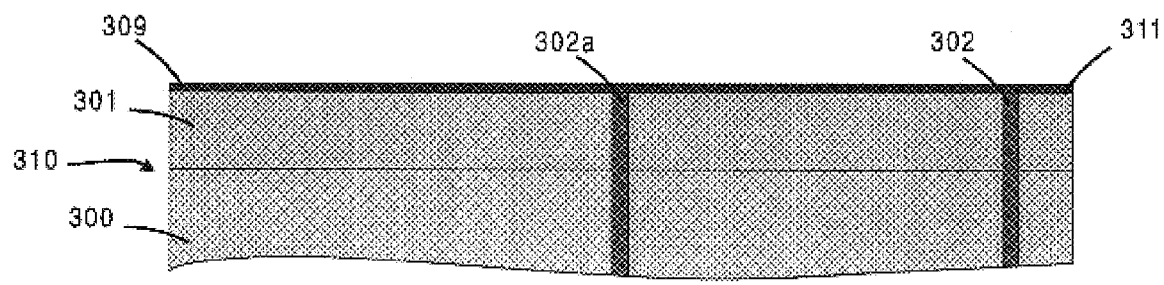
FIG. 16 is a cross-sectional view of a device layer including an alignment trench, an isolation trench, and a dielectric layer.

In accordance with the present invention as integrated into a CMOS flow, FIG. 16 shows a cross-sectional view of a PCW having lightly-doped layer 301 on heavily-doped silicon layer 300, forming device layer 310. In another embodiment of the invention, the device layer is formed from a single layer of lightly-doped silicon.

As shown in FIG. 16, a PCW is provided with at least two substantially-filled alignment trenches 302 exposed from first surface 311 of device layer 310. When a PCW includes only two exposed alignment trenches 302, alignment trenches will typically be spaced greater than 5 cm apart. A PCW will typically include two or more alignment trenches as well as a plurality of isolation trenches 302a for isolating subsequently-defined mechanical structures from subsequently-defined circuits.

Many CMOS process sequences include an initial step of growing a thin thermal oxide layer (~10–200 nm) on the substrate surface, followed by deposition of a thin CVD silicon nitride layer (in a range of about 20–200 nm) to form a dielectric layer 309; however, a single dielectric material or a different combination of dielectric materials may comprise dielectric 309 depending on the specificities of the CMOS process flow. This step generally precedes well region formation, and formation of device features such as gate active (source/drain) regions.

Figure 17:
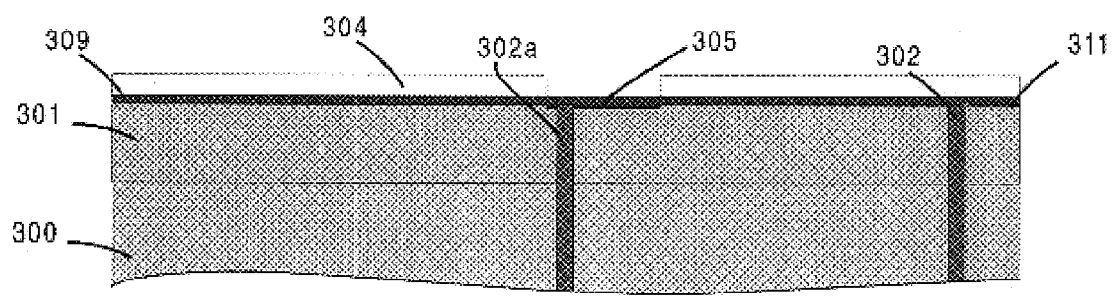
FIG. 17 is a cross-sectional view of a device layer including an alignment trench, an isolation trench, a dielectric layer, a first pattern, and a doped region defined by a first pattern.

At this point in accordance with the present invention the basic CMOS process flow is modified by adding a masking step, an implantation step, and a drive-in step. In accordance with the invention, a photolithographic mask is aligned to alignment trenches 302 and used to form a first pattern in photosensitive material 304 on dielectric 309. Next, the portion of the substrate exposed through photoresist mask 304 is doped by ion implanting through dielectric layer 309, to provide desired doping species to region 305 shown in FIG. 17. Typical doses are of the order of $1\times10^{14}$ cm$^{-2}$ to $1\times10^{16}$ cm$^{-2}$, with energies on the order of 50 keV to 500 keV. When device layer 310 includes lightly-doped layer 301 on heavily-doped layer 300 the sinker dopant type is similar (i.e. p-type or n-type) to the doping type of heavily doped silicon layer 300, although the species may be different.

Figure 18:
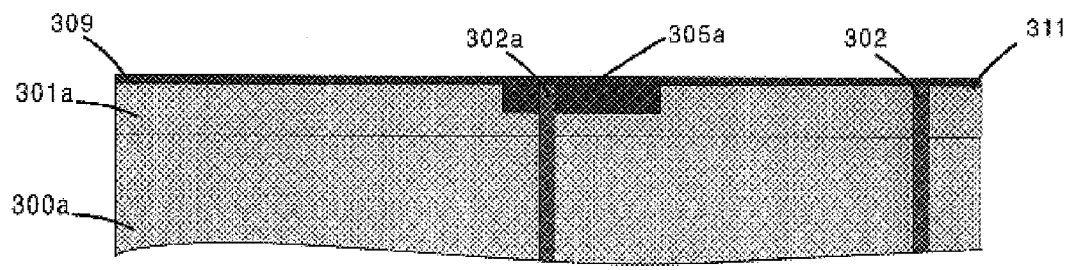
FIG. 18 is a cross-sectional view of a device layer including an alignment trench, an isolation trench, a dielectric layer, and an initial sinker.

Next, as illustrated in FIG. 18, photoresist mask 304 is removed and a high-temperature sinker drive-in diffusion step is performed forming an initial sinker 305a.

Figure 19:
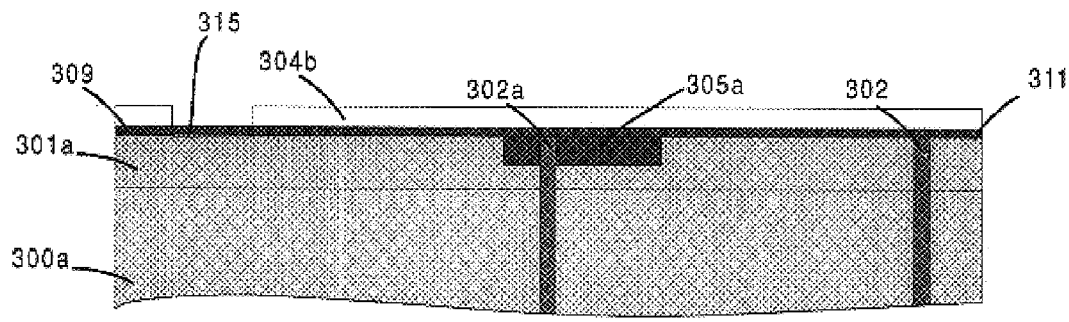
FIG. 19 is a cross-sectional view of a device layer including an alignment trench, an isolation trench, a dielectric layer, an initial sinker, a second pattern, and a doped region defined by a second pattern.

After sinker drive-in, the CMOS process flow continues largely unaffected by any of the sinker masking, implantation or diffusion steps. For example, referring to FIG. 19, CMOS-well definition may continue by photolithographically patterning a spun-on photoresist layer 304b, using a CMOS-well mask aligned to alignment trenches 302, and implanting well-dopant 315 through dielectric 309. Note that before well implantation, many CMOS processes etch partially or fully through dielectric layer 309 using photoresist layer 304b as an etch mask. Furthermore, a twin-well CMOS technology may be used to form co-fabricated circuitry. Following well formation, the features of the device (gate, source/drain, LDD regions and the like) may be constructed.

Figure 20:
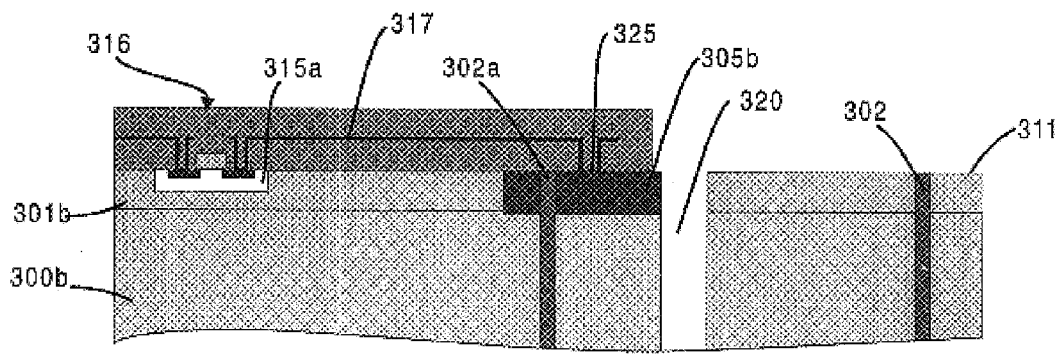
FIG. 20 is a cross-sectional view of a device layer including an alignment trench, an isolation trench, a final sinker, a well, an electrical contact to an isolated structure, an electrical interconnection, and a transistor.

After CMOS-circuit formation, mechanical structures are defined and released according to the specificities of the particular CDMEMS technology. Circuits may include active devices such as transistors 316, and electrical connections such as conductors 317, as shown in FIG. 20, for example. Contact to mechanical structures is made by one or more substrate contacts 325 formed during circuit formation. Mechanical structure definition includes etching a plurality of trenches 320 into the device layer. During circuit formation, initial-sinker 305a will diffuse further, due to high temperature processing steps (especially well-drive steps for forming CMOS-wells 315a), forming final-sinker 305b. When device layer 310 comprises lightly-doped layer 301 on heavily-doped silicon substrate 300, up-diffusion during sinker-drive in and circuit processing will dope lightly-doped layer 301 from the bottom, resulting in reduced-thickness, lightly-doped layer 301 a, 301b. A low-resistivity structure may be formed if final sinker 305b extends at least as deep as up-diffused dopants from heavily-doped layer 300.

The sinker drive-in beneficially enables sinker depth and doping profile to be decoupled from circuit diffusions. Decoupling, for example, enables formation of sinker 305b extending further into device substrate 310 then well 315a in a CMOS technology, thereby providing for low resistivity structures while not affecting circuit parameters. When device layer 310 includes lightly-doped layer 301 on heavily-doped layer 300, the thickness of lightly-doped layer 301 will typically have to be increased over the nominal lightly-doped layer thickness for standard processing due to up-diffusion of dopants from heavily-doped silicon 300 during sinker drive-in. When device layer 310 includes lightly-doped layer 301 on heavily-doped layer 300, sinker 305b will typically extend into the wafer, merging into heavily-doped silicon layer 300b. When device layer 310 layer does not include heavily-doped layer 300, sinker 305b will typically extend as deep as the subsequently defined mechanical structures.

Hence, in accordance with the aforementioned embodiments, the invention enables low-resistance mechanical structures to be co-fabricated into the same substrate on which active semiconductor devices, such as transistors, are formed. The invention provides for easy and accurate alignment of sinker diffusion to areas where structures and circuits are subsequently formed. Depending on the specific circuit technology being implemented, the invention may reduce structural resistance by up to several orders of magnitude while requiring minimal modification of circuit processing. The invention improves performance of a large class of sensors and actuators. Furthermore, the benefits of the invention may be attained using a minimal number of processing steps.

The foregoing description, for the purposes of explanation, makes use of specific nomenclature and parameters to provide a thorough understanding of the invention. However, it will be apparent to one skilled in the art that the specific details are not required in order to practice the invention. Thus, the foregoing descriptions of specific embodiments of the invention are presented for the purposes of illustration and description. The embodiments were chosen and described in order to best explain the principles of the invention and its practical applications, to thereby enable others skilled in the art to best utilize the invention and various embodiments with various modifications as are suited to the particular use contemplated. Such embodiments are not intended to be exhaustive or to limit the invention to the precise forms disclosed, obviously many modifications and variations are possible in view of the above teachings. For example, certain dielectric layers need not be present to practice the invention; a well drive-in that is part of circuit formation may be used in lieu of the sinker drive-in, especially if the sinker dopant species diffuses substantially faster than the slowest well dopant when a CMOS process is used to form circuits; sinker regions may be defined before isolation trench formation, a photolithographic mask for defining isolation trenches being aligned to a hard-mask pattern or hardened photoresist pattern used to define sinker regions; sinker regions may be defined before isolation trench formation, a photolithographic mask for defining isolation trenches being aligned to a pattern in a thermally-grown oxide after sinker doping.

What is claimed is:

1. A microelectromechanical device comprising:
   a substrate having a device layer, said device layer having a first surface;
   a plurality of isolation trenches having a first side and a second side formed in said device layer;
   at least one active device formed in said device layer on a first side of one of said plurality of isolation trenches;
   at least one structure trench formed in said substrate, said structure trench defining at least one electrically isolated movable micromechanical structure on the second side of said one of said plurality of isolation trench; and
   a low-resistivity sinker of diffused dopant, said sinker extending from said first surface of said device layer towards the bottom of said at least one structure trench.

2. The device of claim 1 wherein said substrate comprises a silicon wafer and said device layer comprises silicon doped to a level of between 1 and 50 Ohm-cm.

3. The device of claim 1 wherein:
   said substrate comprises a bonded-silicon wafer; and
   said device layer comprises a layer of silicon doped to a level of between 1 and 50 Ohm-cm and a thickness of less than 25 microns.

4. The device of claim 1 wherein:
   said substrate comprises a silicon-on-insulator wafer; and
   said device layer comprises a layer of silicon doped to a level of between 1 and 50 Ohm-cm and a thickness of less than 25 microns.

5. The device of claim 1 wherein:
   said substrate is selected from one of: silicon wafer, silicon-on-insulator wafer, or bonded silicon wafer;
   said device layer includes a lightly-doped layer of silicon disposed upon a heavily-doped layer of silicon; and
   said dopant is of the same type as said heavily-doped layer of silicon.

6. The device of claim 1 wherein said at least one active device includes at least a MOS transistor and said sinker extends from said first surface of device layer towards the bottom of said at least one structure trench to a depth greater than the depth of a diffusion region integral to said MOS transistors.

7. The device of claim 5 wherein said sinker extends from said first surface of device layer towards the bottom of said at least one structure trench and merges with said heavily doped layer.

8. The device of claim 5 wherein the thickness of said lightly-doped layer accounts for up-diffusion in said diffusion step.

9. The device of claim 5 wherein said lightly-doped layer of silicon is formed from an epitaxially grown layer of silicon.

10. The device of claim 5 wherein:

said at least one device includes at least a MOS transistor;

said sinker extends from said first surface of device layer towards the bottom of said at least one structure trench to a depth greater than the depth of a diffusion region integral to said MOS transistors; and at least a portion of said sinker merges with said heavily doped layer.

11. The device of claim 5 wherein said heavily-doped layer of silicon is n-type, said lightly-doped layer of silicon is n-type, and said dopant includes Phosphorous.

12. The device of claim 5 wherein said heavily-doped layer of silicon is p-type, said lightly-doped layer of silicon is p-type, and said dopant includes Boron.

13. The device of claim 5 wherein said heavily-doped layer of silicon is n-type, said lightly-doped layer of silicon is p-type, and said dopant includes Phosphorous.

14. The device of claim 5 wherein said heavily-doped layer of silicon is p-type, said lightly-doped layer of silicon is n-type, and said dopant includes Boron.

15. The device of claim 1 wherein said microelectromechanical device comprises a sensor.

16. The device of claim 1 wherein said microelectromechanical device comprises an actuator.

* * * * *

UNITED STATES PATENT AND TRADEMARK OFFICE
CERTIFICATE OF CORRECTION

| | | |
|---|---|---|
| PATENT NO. | : 6,703,679 B1 | Page 1 of 1 |
| APPLICATION NO. | : 09/612482 | |
| DATED | : March 9, 2004 | |
| INVENTOR(S) | : Mark A. Lemkin | |

It is certified that error appears in the above-identified patent and that said Letters Patent is hereby corrected as shown below:

On the Title sheet, (54) Title of invention: The last word "CIRCUIT" should be changed to --CIRCUITS--

Column 10, line 37, Claim 1: After "isolation" and before "and" replace "trench;" with --trenches;--

Signed and Sealed this

Eighteenth Day of September, 2007

JON W. DUDAS
*Director of the United States Patent and Trademark Office*